United States Patent
Norton et al.

(10) Patent No.: US 10,678,008 B1
(45) Date of Patent: Jun. 9, 2020

(54) OPTICAL SIGNAL AGGREGATION FOR OPTICAL COMMUNICATION IN HIGH BANDWIDTH, HIGH DENSITY ARCHITECTURES

(71) Applicant: HEWLETT PACKARD ENTERPRISE DEVELOPMENT LP, Houston, TX (US)

(72) Inventors: John Norton, Houston, TX (US); Kevin B. Leigh, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/193,875

(22) Filed: Nov. 16, 2018

(51) Int. Cl.
| | |
|---|---|
| *H04B 10/00* | (2013.01) |
| *G02B 6/42* | (2006.01) |
| *H01R 12/73* | (2011.01) |
| *H05K 7/14* | (2006.01) |
| *H04B 10/80* | (2013.01) |
| *H01R 13/621* | (2006.01) |
| *H01R 12/79* | (2011.01) |

(52) U.S. Cl.
CPC ........... *G02B 6/428* (2013.01); *H01R 12/732* (2013.01); *H04B 10/801* (2013.01); *H05K 7/1422* (2013.01); *G02B 6/4269* (2013.01); *H01R 12/737* (2013.01); *H01R 12/79* (2013.01); *H01R 13/621* (2013.01)

(58) Field of Classification Search
CPC ......... H04B 10/40; H04B 10/58; H04J 14/02; H04J 14/0278; G02B 6/4292; G02B 6/4246; G02B 6/4261; G02B 6/4268

USPC ....... 398/135, 136, 137, 138, 139, 164, 158, 398/159, 79; 385/88, 89, 90, 92, 93
See application file for complete search history.

(56) References Cited

U.S. PATENT DOCUMENTS

| | | | |
|---|---|---|---|
| 5,993,251 | A | 11/1999 | Brown |
| 7,234,880 | B1 | 6/2007 | Charny |
| 7,918,611 | B2 | 4/2011 | Hudgins |
| 8,300,417 | B2 | 10/2012 | Leibowitz |
| 8,750,710 | B1 | 6/2014 | Hirt et al. |
| 2005/0271391 | A1 | 12/2005 | Togami |
| 2007/0140626 | A1 | 6/2007 | Chan |
| 2007/0258715 | A1* | 11/2007 | Androni .......... H04J 14/02 398/164 |

(Continued)

FOREIGN PATENT DOCUMENTS

| | | |
|---|---|---|
| CN | 207780553 | 8/2018 |
| WO | WO-2017019083 | 2/2017 |

OTHER PUBLICATIONS

Copending application entitled "Modular Faceplate Optical Connection" filed Sep. 6, 2018, U.S. Appl. No. 16/123,195.

(Continued)

*Primary Examiner* — Hanh Phan
(74) *Attorney, Agent, or Firm* — Nolte Intellectual Property Law Group

(57) ABSTRACT

An electro-optical aggregator system includes: a system board; a plurality of cards electrically connected to the system board, the plurality of cards each comporting with a standard form factor; and an electro-optical aggregator card comporting with the standard form factor and trafficking electrical signals with the plurality of cards, the electro-optical aggregator card including an optical transceiver chip through which the trafficked signals are optically communicated.

20 Claims, 7 Drawing Sheets

(56) References Cited

U.S. PATENT DOCUMENTS

2009/0279889 A1* 11/2009 Kirkpatrick ...... H04B 10/25752
                                                    398/41
2010/0246118 A1   9/2010 Attlesey
2016/0380698 A1* 12/2016 Elahmadi ............... H04B 10/40
                                                   398/135

OTHER PUBLICATIONS

"PCIe X4 Gigabit Fiber Card Single Mode 1310nm 10km LC Optical Transceiver Module", Accessed on Sep. 24, 2018, 30 pages.
Samteo, "Pcie®-Over-Fiber Adaptor Card", Apr. 2018, 2 pages.

* cited by examiner

OPTICAL SIGNAL AGGREGATION FOR OPTICAL COMMUNICATION IN HIGH BANDWIDTH, HIGH DENSITY ARCHITECTURES

BACKGROUND

As the capabilities of and demands upon large scale computing systems increase, the adoption of optical technologies increases. Significant portions of such computing remain electrical for at least the time being. Technologies facilitating the conjoint use of electrical and optical signals have therefore become more significant. For example, optical signals may be converted to electrical signals and vice versa. At the same time, considerations such as high bandwidth and high density should be observed and considered.

BRIEF DESCRIPTION OF THE DRAWINGS

Examples described herein may be understood by reference to the following description taken in conjunction with the accompanying drawings, in which like reference numerals identify like elements.

While examples described herein are susceptible to various modifications and alternative forms, the drawings illustrate specific examples herein described in detail by way of example. It should be understood, however, that the description herein of specific examples is not intended to be limiting to the particular forms disclosed, but on the contrary, the intention is to cover all modifications, equivalents, and alternatives falling within the spirit and scope of the examples described herein and the appended claims.

DETAILED DESCRIPTION

Illustrative examples of the subject matter claimed below will now be disclosed. In the interest of clarity, not all features of an actual implementation are described in this specification. It will be appreciated that in the development of any such actual example, numerous implementation-specific decisions will be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

The present disclosure provides a technique in which electrical signals from a plurality of cards may be aggregated to a single electro-optical aggregator card. The electro-optical aggregator card includes an optical transceiver chip through which the aggregated electrical signals may be optically communicated. This reduces the overall system cost by reducing the number of optical transceiver chips. It also increases system density by reducing the amount of space needed to accommodate optical transceivers.

Figure 1:
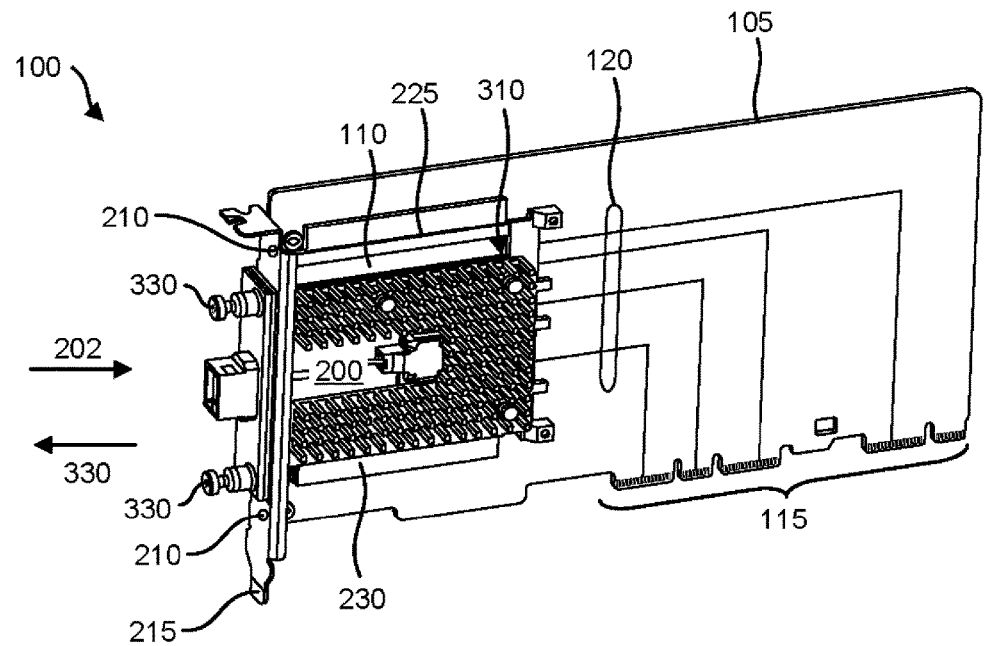
FIG. 1 and FIG. 2 illustrate one example of an electro-optical aggregator card in perspective assembled and exploded views, respectively.
Figure 2:
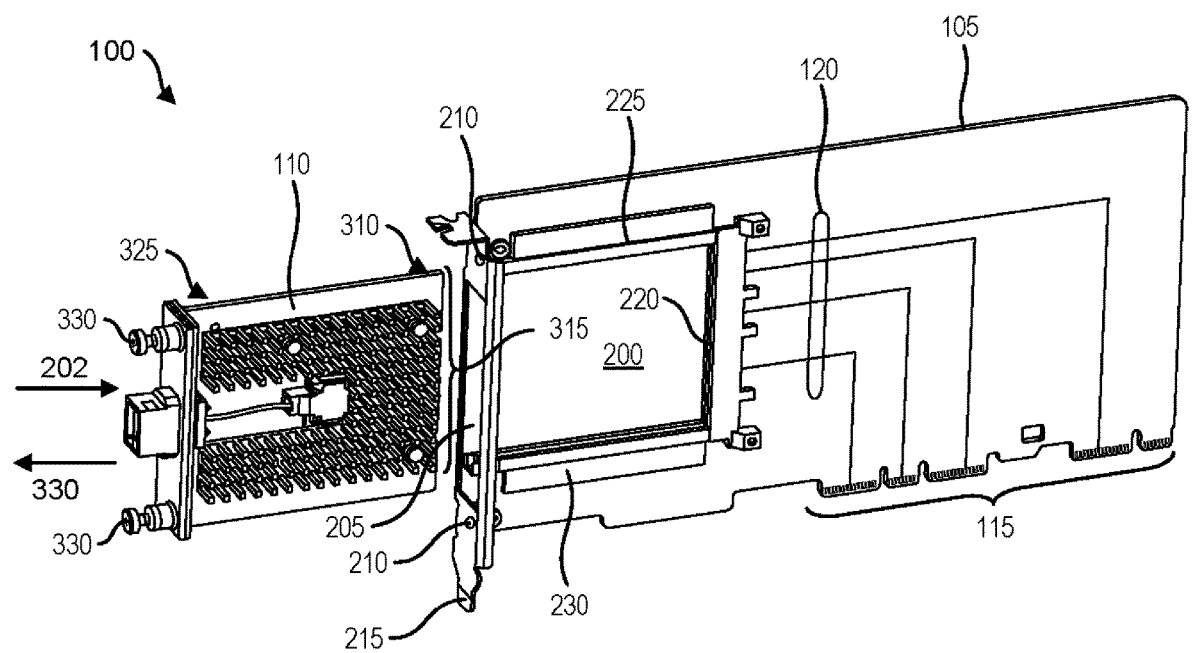

Referring now to FIG. 1 and FIG. 2, collectively, an electro-optical aggregator card 100 is shown. FIG. 1 is an assembled, perspective view and FIG. 2 is a perspective, exploded view. The electro-optical aggregator card 100, in general, comprises two parts—a printed circuit board 105 and an electro-optical module 110. Assembly is performed by inserting the electro-optical module 110 into a bay 200, best shown in FIG. 2, as indicated by the directional arrow 202. The bay is defined by the printed circuit board 105. Once inserted, the electro-optical module 110 is secured in a manner described more fully below.

The bay 200 defined by the printed circuit board 105 includes a guide 230 lining a first side thereof, a guide 225 lining a second side thereof, and a first board electrical interface 220 positioned at a distal end of the bay 200. The guides 230, 225 assist in the insertion of the electro-optical module 110 during assembly and in the removal of the electro-optical module 110 during disassembly. The implementation of the first board electrical interface 220 will be determined in conjunction with the implementation of the electrical interface of the electro-optical module 110 discussed further below. The dimensions of the bay will likewise be a function of the form factor adopted for the electro-optical module 110 in any given implementation.

Figure 6:
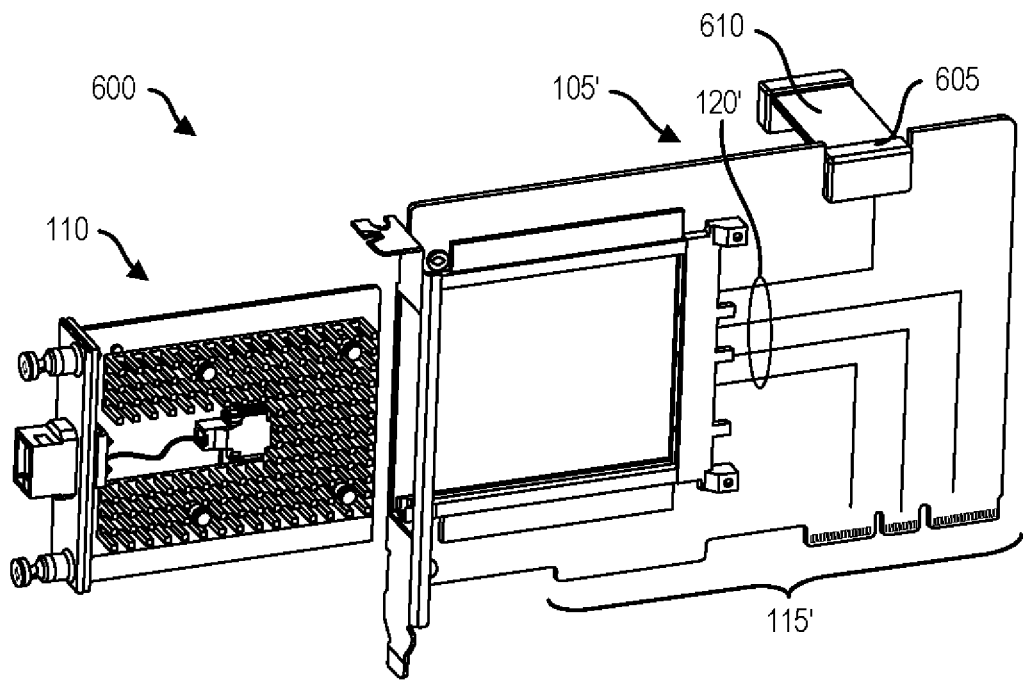
FIG. 6 illustrates a second example of an electro-optical aggregator card in an exploded view.

The electro-optical aggregator card 100 comports with a standard form factor. In the illustrated example, the standard form factor is a Peripheral Component Interconnect Express ("PCIe") Enclosure Compatible Form Factor ("PECFF"). Those in the art having the benefit of this disclosure will appreciate that the PECFF comes in at least two configurations. An example using an alternative PECFF configuration is shown in FIG. 6. Other examples may comport with standard form factors other than PECFF. For instance, the examples of FIG. 7 and FIG. 8 comport with the PCIe form factor. Each of these examples will be discussed in further detail below.

Figure 3:
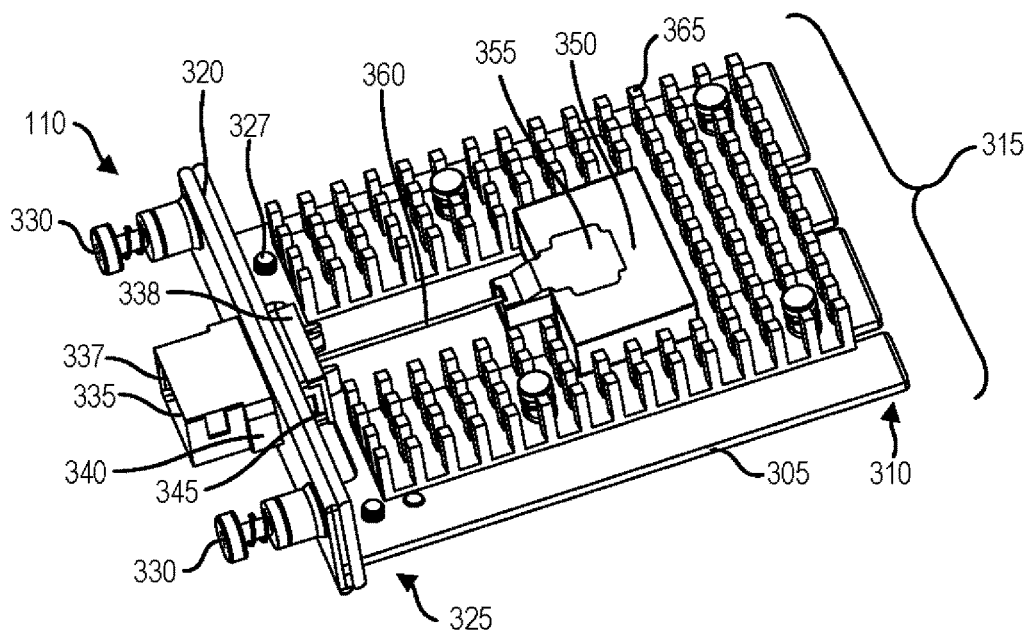
FIG. 3 illustrates a perspective view of one example of an electro-optical module that may be used in the example of FIG. 1 and FIG. 2.

The electro-optical module 110 used in this particular example is shown in FIG. 3. The electro-optical module 110 includes a printed circuit board 305. The printed circuit board 305 is used to mechanically support and electrically connect various components through electrically conductive traces (not shown). At a distal end 310, the printed circuit board 305 includes a module electrical interface 315. The module electrical interface 315 is used to electrically connect electro-optical module 110 to the printed circuit board 105 of the electro-optical aggregator card 100 shown in FIG. 1. Electro-optical module 110 also includes a faceplate 320 modularly attached to a proximal end 325 of printed circuit board 305.

Referring now collectively to FIG. 2 and FIG. 3, the terms "proximal" and "distal" are defined in this context relative to two factors. The first is the opening 205 of the bay 200, both shown in FIG. 2. The second is the orientation of the electro-optical module 110 relative to the opening 205 when the electro-optical aggregator card 100 is assembled as shown in FIG. 1, Thus, in the illustrated example, the "proximal" end 325 is the end at which the optical connector 335 is mounted and the "distal" end 310 is the end at which the module electrical interface 315 is formed.

Still referring to FIG. 3, the term "modularly attached" in this context means that the faceplate 320 may be removed and interchanged with other faceplates 320 having different sizes, orientations, and optical connectivity, among other considerations. The faceplate 320 may be modularly attached to the printed circuit board 305 by means of securing fasteners 327 on a faceplate fastening feature 329. (The faceplate fastening feature 329 is, in the illustrated example, a flange extending from the face of the faceplate 320 along the bottom of the printed circuit board 305.)

The modularity of the faceplate 320 allows the faceplate 320 to be removed from the printed circuit board 305 and exchanged with a different faceplate 320 based on the desired characteristics of the electro-optical module 110. The removability and interchangeability of the faceplates 320 having different sizes, number, orientations, and optical connectivity will be illustrated below. The modular attachment of the faceplate 320 to the printed circuit board 305 may occur during manufacturing to produce different configurations of electro-optical modules 110 using different faceplate 320 types. The fasteners 327 may be a removable type, such as screws, latches, clasps, and the like. In certain configurations the fasteners 327 may be permanent, such as rivets.

Referring collectively to FIG. 1 to FIG. 3, the faceplate 320 has one or more retention devices 330 that may be used to secure the faceplate 320 to the printed circuit board 105 when assembled when assembled as shown in FIG. 1. Examples of retention devices 330 may include, for example, bolts, screws, clips, and/or any other devices that may be used to releasably secure the faceplate 320 to another surface. In the illustrated example, the retention devices 330 are aligned with openings 210 in the bracket 215, both shown in FIG. 2, as the electro-optical module 110 is inserted into the bay 200. Once the module electrical interface 315 of the electro-optical module 110 is blind mated to the first board electrical interface 220 of the printed circuit board 105, the retention devices 330 are rotated to engage the bracket 215 through the openings 210.

Returning to FIG. 3, the electro-optical module 110 also includes a faceplate optical connector 335 that is modularly disposed through the faceplate 320. The faceplate optical connector 335 may include a ferrule to which optical fibers 360 are coupled and a housing to securely hold a ferrule by means of ferrule retention feature, none of which are independently shown. The ferrule may be modularly installed within the housing. However, unless explicitly described, the term "faceplate optical connector" will be used as an inclusive term hereafter representing both the connector housing and the ferrule.

The faceplate optical connector 335 provides optical connectivity between an external optical cable (not shown) and the electro-optical module 110. The external optical cable may be plugged into the proximal end 337 of the faceplate optical connector 335, thereby allowing a signal to be sent from another apparatus (not shown) to the electro-optical module 110 when assembled into the electro-optical aggregator card 100, shown in FIG. 1. The signal may then be sent from the electro-optical aggregator card 100 to, for example, a computing system (not shown) into which the electro-optical aggregator card 100 is installed.

The faceplate optical connector 335 is modularly installed and, as such, may be removed and replaced with different faceplate optical connectors 335 based on, for example, the type and/or number of optical cables in use. In this context, "modularly disposed" or "modularly installed" means that the faceplate optical connector 335 may be removed to accommodate replacement, relocation, or some other purpose. A faceplate optical connector 335 may be retained on the faceplate 320 by means of connector retention devices such as clips on the inner portion 345 of the connector, or screws on the outer portion 340 of the connector. Removal of the faceplate optical connector 335 may include disconnecting the connector retention device and displacing the optical connector 335 from the void (not shown) of the faceplate 320.

The electro-optical module 110 may also include an optical transceiver chip 350 disposed on and electrically connected to the printed circuit board 305. The optical transceiver chip 350 is a high lane-count transceiver, e.g., 24 lanes. The optical transceiver chip 350 is an integrated circuit configured to receive external data from an external optical cable and transmit the data to other system components by transferring the data through connections on the printed circuit board 305 when the electro-optical aggregator card 100 is assembled and in operation. A chip optical connector 355 is disposed on and connected to the optical transceiver chip 350.

The chip optical connector 355 is optically connected to the faceplate optical connector 335 through an optical fiber jumper 360. The optical fiber jumper 360 may include multiple optical fibers wrapped within a protection sleeve jacket. The optical fiber jumper 360 allows data to be sent from the faceplate optical connector 335 to the chip optical connector 355 and then to the optical transceiver chip 350. The length and orientation of the optical fiber jumper 360 may vary based on the size and orientation of the electro-optical module 110, as well as the system (not shown) in which the electro-optical aggregator card 100 is installed.

During operation of the electro-optical module 110, conditions specific to the computing environment may change. For example, the type of optical fiber being used may change, thereby requiring the modification of one or more components of the electro-optical module 110. While specific implementations will be discussed in detail below, generally, the modularity of the faceplate 320, the faceplate optical connector 335, and the ability to adapt the optical fiber jumper 360 to changing conditions may allow for the adaption of the electro-optical module 110 to meet specific needs. For example, the number, size, and orientation of the faceplate optical connectors 335 may be modified by replacing the faceplate 320 or specific faceplate optical connectors 335. Furthermore, different optical fiber jumpers 360 may be employed, thereby allowing the differing types of faceplate optical connectors 335 to retain connectivity with the chip optical connector 355.

The electro-optical module 110 may further include other components to improve the operability of the device. In certain implementations, heat management devices, such as the heatsinks 365 (only one indicated), may be disposed on the electro-optical module 110. The number, orientation, and placement of the heatsinks 365 may vary based on the type of airflow within a computing system. Similarly, the faceplate 320 may include various other heat management options (not shown), such as vents to allow air circulation over printed circuit board 305, as well as options to allow liquid cooling. Furthermore, the electro-optical module 110 may also include additional integrated circuits disposed on the printed circuit board 305, such as signal conditioners, along with corresponding heat sinks (not shown) that are independent from the heatsinks 365.

Figure 4A:
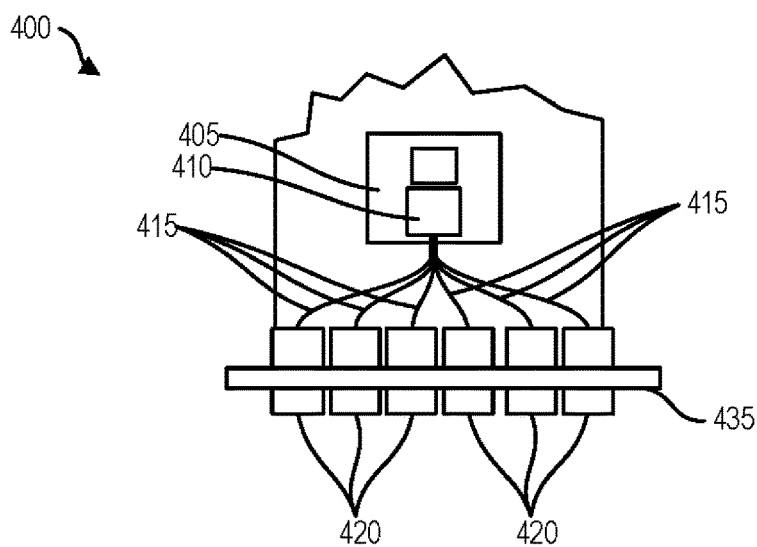
FIG. 4A and FIG. 4B conceptually illustrate respective plan views of a second example of an electro-optical module that also may be used in the example of FIG. 1 and FIG. 2.
Figure 4B:
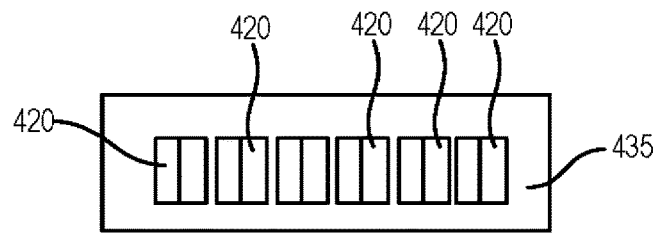

FIG. 4A and FIG. 4B conceptually illustrate respective plan views of a second example of an electro-optical module that also may be used in the example of FIG. 1 and FIG. 2. Those of ordinary skill in the art having benefit of the present disclosure will appreciate that electro-optical module 110 of FIG. 3 may be modularly adapted to incorporate different faceplates 320 having differing numbers and types of optical connectors 335 as discussed above. Referring to FIG. 4A and FIG. 4B together, a top view and an end view, respectively, of an electro-optical module 400 according to an example is shown. The electro-optical module 400 includes one optical transceiver chip 405, connected to one chip optical connector 410, which is connected to multiple optical fiber jumpers 415, which are subsequently connected to multiple faceplate optical connectors 420.

In this implementation, independent faceplate optical connectors 420 are illustrated on a larger form factor faceplate 435. Such a connection may be used to connect six two-fiber, LC-duplex connectors to corresponding faceplate optical connectors 420, thereby allowing signal transmission therethrough. In this implementation the faceplate optical connectors 420 provide six independent one-lane ports. Such an example may further provide for more or larger heatsinks (not shown) due to the larger form factor.

Figure 5:
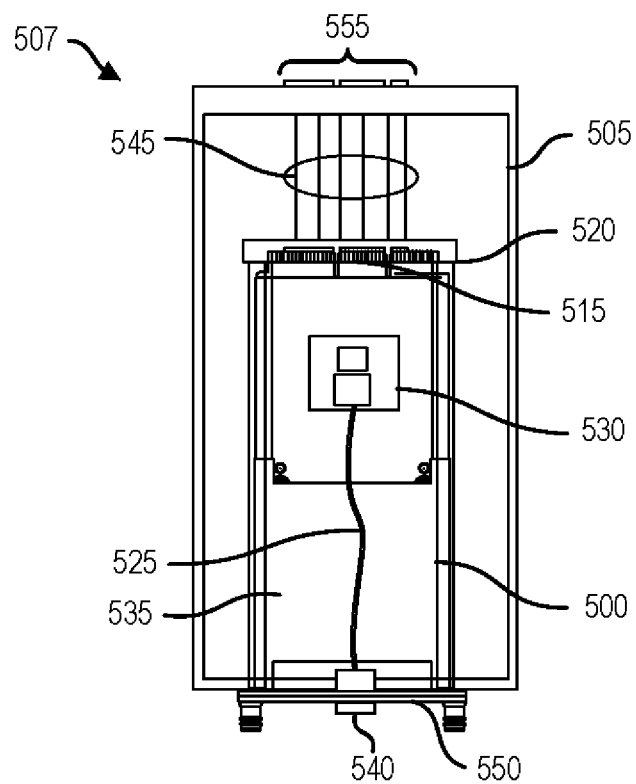
FIG. 5 schematically illustrates a third example of an electro-optical module in accordance with one or more examples.

Turning now to FIG. 5, the electro-optical module 110 is amenable to variation beyond what is discussed above. FIG. 5 schematically illustrates a third example of an electro-optical module in accordance with one or more examples in a top view. This example shows an electro-optical module 500 assembled into a printed circuit board 505 to create an electro-optical aggregator card 507. The printed circuit board 505 further has a pair of guides 510 configured to guide electro-optical module 500 to allow the module electrical interface 515 to be in connection with the first board electrical interface 520.

In this example, the electro-optical module 500 further includes an extended carrier bracket 535 that extends the electro-optical module 500 longitudinally. Because the extended carrier bracket 535 extends electro-optical module 500, a relatively longer optical fiber jumper 525 is used to connect the optical transceiver chip 530 to the faceplate optical connector 540. The extended carrier bracket 535 may be formed from any material capable of holding and extending electro-optical module 500.

The length of the extended carrier bracket 535 allows the electro-optical module 500 to connect to the first board electrical interface 520 at a location longitudinally deep inside the printed circuit board 505. Because the electro-optical module 500 connects to the first board electrical interface 520 relatively close to the second board electrical interface 555, the lengths of electrically conductive traces 545 are shorter. As such, signal loss along electrically conductive traces 545 may decrease, thereby allowing faster transfer rates with lower signal loss. As described above, the electro-optical module 500 may be modularly adapted to meet changing conditions in a computing environment.

Returning now to FIG. 2 and FIG. 3 collectively, in the illustrated example, the module electrical interface 315 is an edge contact connector and the first board electrical interface 220 is a socket for receiving edge connectors. However, module electrical interface 315 may also include beam contact-type connectors, for example, and the first board electrical interface 220 will be implemented accordingly to serve as receptacle or pad for the beam contact type connectors. The connection between the module electrical interface 315 and the first board electrical interface 220 is a blind mate connection in the illustrated example.

Referring now to FIG. 1 and FIG. 2, the printed circuit board 105 also includes a second board electrical interface 115. The second board electrical interface 115 is an edge contact connector. In alternative examples, the second board electrical interface may be, for example, beam contact-type connectors or some other technology. The second board electrical interface 115 blind mates with a socket on a system board (not shown) as the electro-optical aggregator card 100 is assembled into an electro-optical aggregator system as will be discussed further below.

The printed circuit board 105 further includes a plurality of electrical traces 120 between the first board electrical interface 220 and the second board electrical interface 115. Note that the electrical traces 120 depicted in FIG. 1 and FIG. 2 are representative only and do not necessarily depict any particular implementation. The number and routing of the electrical traces 120 will depend to some degree on the form factor with which the electro-optical aggregator card 100 comports, as will be apparent from the discussion below of alternative examples.

The electrical traces 120 support a number of "lanes" over which electrical signals are transmitted, each "lane" including two signals—a transmit signal and a receive signal. A transmit signal is "transmitted" in the sense that it is received from another card (not shown) or from the system board (also not shown) to be transmitted to another card or another system board through an external optical cable (also not shown). In the example of FIG. 1 and FIG. 2, the electro-optical aggregator card 100 supports 24 lanes on the electrical traces 120.

Referring now to FIG. 1 to FIG. 3 collectively, in operation, the electro-optical aggregator card 100 receives an electrical transmit signal via the second board electrical interface 115 that travels through the electrical traces 120, the first board electrical interface 220, and the module electrical interface 315 to the optical transceiver chip 350. The optical transceiver chip 350 converts the electrical transmit signal to an optical transmit signal and transmits it through the optical jumper 360 and the optical faceplate connector 335. The electro-optical aggregator card 110 receives an optical receive signal via the optical faceplate connector 335, the optical jumper 360, and the optical transceiver chip 350. The optical transceiver chip 350 then converts the optical receive signal into an electrical receive signal that is then transmitted through the module electrical interface 315, the first board electrical interface 220, the electrical traces 120, and the second board electrical interface 115.

FIG. 6 illustrates a second example of an electro-optical aggregator card in an exploded view. The electro-optical aggregator card 600 comports with a variation of the PECFF form factor different from that of FIG. 1 and FIG. 2. The electro-optical aggregator card 600 includes an electro-optical module 110 and a printed circuit board 105'. The printed circuit board 105' includes a third board electrical interface 605, which in this example is an electrical connector by which an external electrical cable 610 may be connected to the printed circuit board 105'. A portion of the electrical traces 120' are routed to the second board electrical interface 115' and a portion are routed to the third board electrical interface 605. Note how the form factor has therefore affected the routing of the electrical traces 120'. In this example, the second board electrical interface 115' supports 16 lanes of signals and the third board electrical interface 605 supports 8 lanes of signals.

Figure 7:
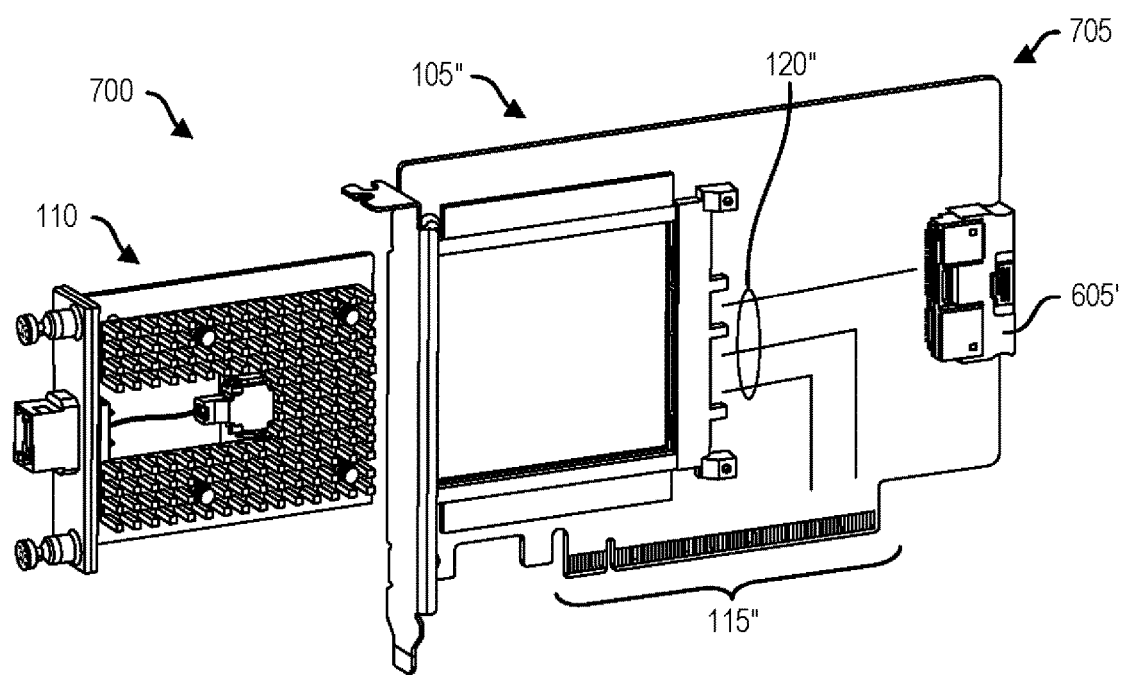
FIG. 7 illustrates a third example of an electro-optical aggregator card in an exploded view.

FIG. 7 illustrates a third example of an electro-optical aggregator card in another exploded view. The electro-optical aggregator card 700 in this example comports with the PCIe form factor. The second board electrical interface 115" supports 16 PCIe lanes of signals and the third board electrical interface 605', an electrical connector, supports eight PCIe lanes of signals. Note that the third board electrical interface 605' is positioned on the distal end 705 of the printed circuit board 105". Note how the position of the third board electrical interface 605', a function of the PCIe form factor, influences the routing of the electrical traces 120". Note also the PCIe form factor will dictate various operating characteristics of the electrical traces 120".

Figure 8:
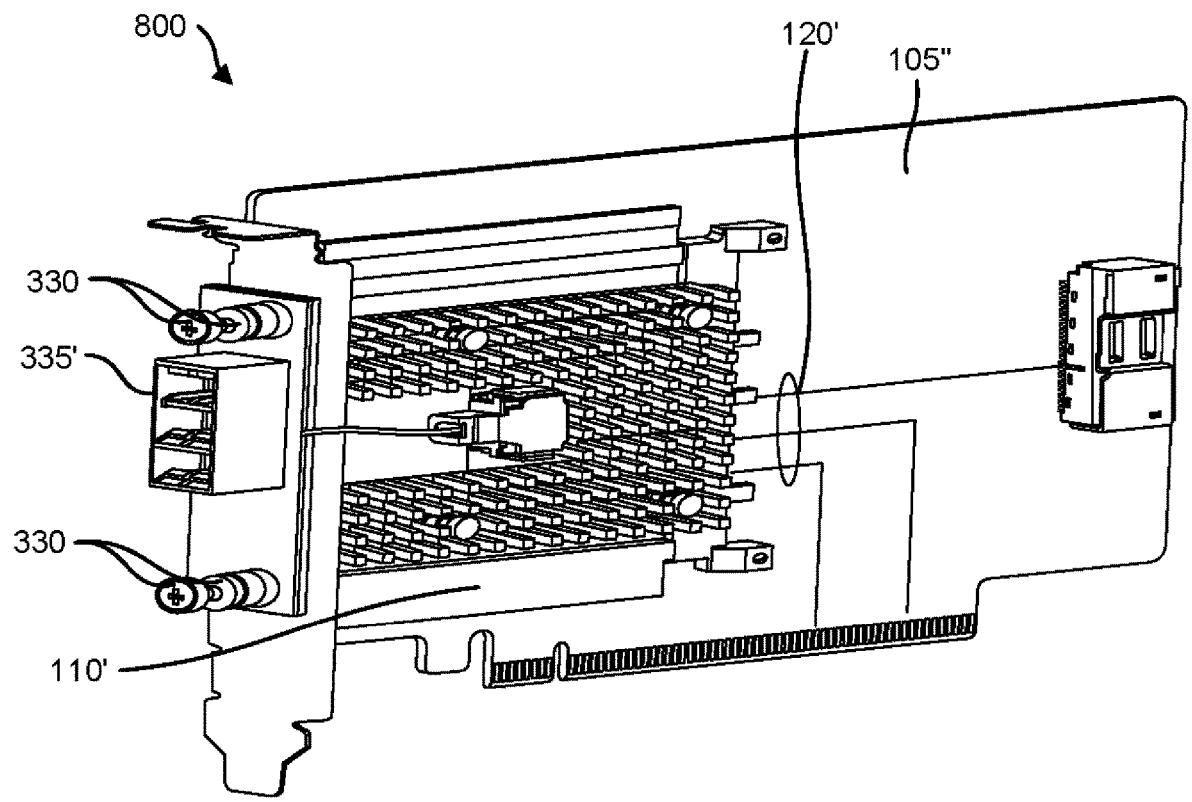
FIG. 8 illustrates a fourth example of an electro-optical aggregator card in an assembled view.

FIG. 8 illustrates a fourth example of an electro-optical aggregator card in an assembled view. The electro-optical aggregator card 800 includes a faceplate 320' that includes four retention mechanisms 330. The electro-optical module 110' includes faceplate optical connector 335' that has connections for three external optical cables (not shown).

Figure 9:
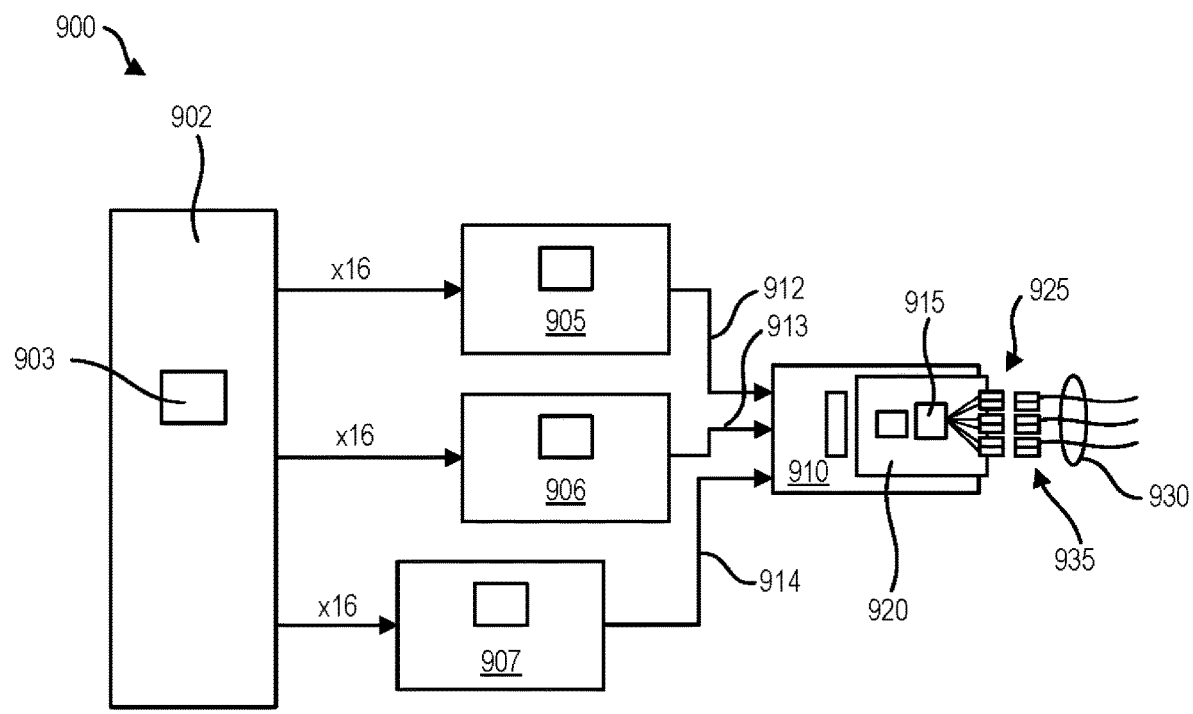
FIG. 9 conceptually depicts one example of an electro-optical aggregator system.

FIG. 9 conceptually depicts one example of an electro-optical aggregator system 900. The electro-optical aggregator system 900 includes a system board 902, a plurality of cards 905-907 electrically connected to a system chipset 903 of the system board 902, and an electro-optical aggregator card 910. Each of the cards 905-907 comports with a standard form factor such as PECFF or PCIe. The electro-optical aggregator card 910 also comports with the standard form factor. The electro-optical aggregator card 910 traffics electrical signals with the plurality of cards 905-907 over the respective electrical connections 912-914. The electro-optical aggregator card 910 includes an optical transceiver chip 915 mounted on an electro-optical module 920.

The trafficked signals are optically communicated by the electro-optical aggregator card 910 via the optical transceiver chip 915, optical faceplate connectors 925, and a plurality of external optical cables 930 including mating optical cable connectors 935. In this example, the cards 905-907 communicate with the system board 902 over 16 lanes of signals. Eight of those lanes are aggregated to the electro-optical aggregator card 910 over the electrical connections 912-914. The electrical connections 912-914 may be implemented in either electrical traces or electrical cables.

Figure 10:
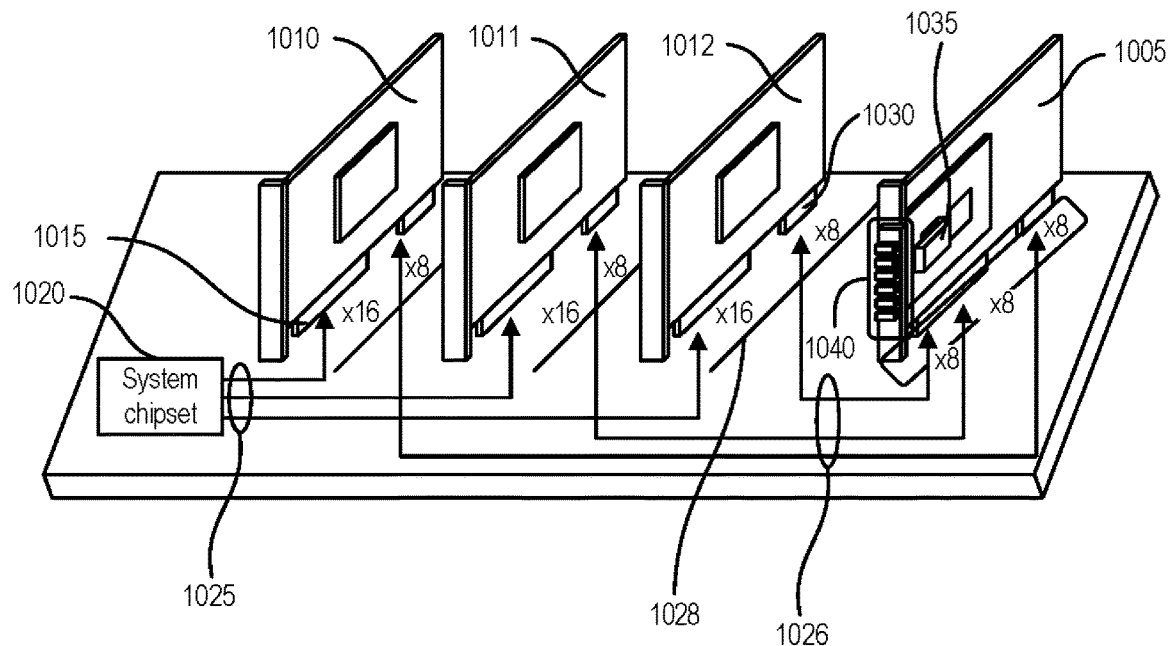
FIG. 10 schematically illustrates one implementation of the electro-optical aggregator system of FIG. 9.

FIG. 10 schematically illustrates one implementation of the electro-optical aggregator system of FIG. 9 in an exploded view. The electro-optical aggregator system 1000 includes an electro-optical aggregator card 1005, a plurality of cards 1010-1012, and a system board 1015. The cards 1010-1012 are, in this particular example, accelerator cards. However, in alternative examples, they may be practically any kind of card that might be encountered in a computing system such as network interface cards, processor cards, security cards, or artificial intelligence/machine learning cards. They may also be combinations of various type cards such as those listed above.

The system board 1015 includes a system chipset 1020, a plurality of electrical interfaces 1028 (only one indicated), and a plurality of electrical traces 1025, 1026. The cards 1010-1012 and the electro-optical aggregator card 1005 are blind mated to the system board 1015 via their electrical interfaces 1030 and the system board's electrical interfaces 1028. The system chipset 1030 communicates with the cards 1010-1012 via the electrical traces 1025. Each of the cards 1010-1012 traffics 16 lanes of signals over the electrical traces 1025. The cards 1010-1012 communicate with the electro-optical aggregator card 1005 over the electrical traces 1026. Each of the cards 1010-11012 traffics 8 lanes of signals over the electrical traces 1026.

In operation, the electro-aggregator card 1005 "aggregates" electro-optical signals trafficked between the electro-aggregator card 1005 and the cards 1010-1012. Transmit signals generated by the cards 1010-1012 are electrically transmitted to the electro-aggregator card 1005 over the electrical traces 1026. The transmit signal is then converted to an optical signal by the optical transceiver chip 1035 and transmitted via the optical faceplate connector(s) 1040 and external optical cables (not shown). Received signals are received over external optical cables (not shown) by the electro-optical aggregator card 1005 through the optical faceplate connector(s) 1040. The optical transceiver chip 1035 converts them to electrical signals that are then transmitted to the cards 1010-1012 via the traces 1026.

While signals are trafficked among the electro-optical aggregator card 1005 and the cards 1010-1012, not all examples will be so limited. Some examples of electro-optical aggregator cards disclosed herein and discussed above have electrical interfaces that include electrical connectors. If such electro-optical aggregator cards are used in a system such as the one shown in FIG. 10, some of the signals may be trafficked over cables rather than electrical traces.

Figure 11:
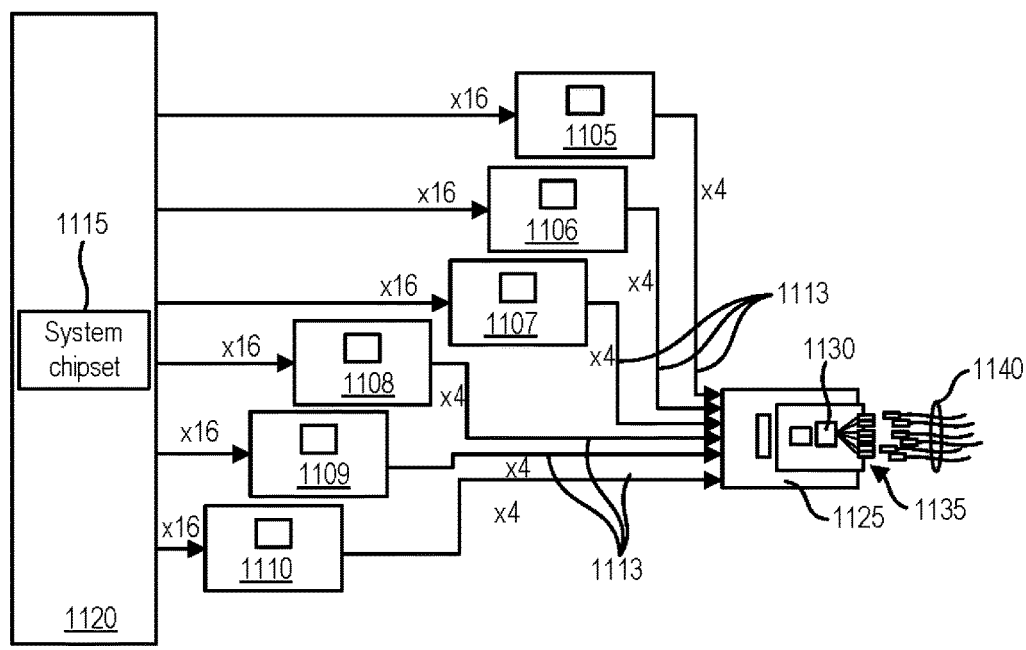
FIG. 11 conceptually depicts a second example of an electro-optical aggregator system.

FIG. 11 conceptually depicts a second example of an electro-optical aggregator system. In the electro-aggregator system 1100, there are six cards 1105-1110. Again, the cards 1105-1110 are, in this particular example, accelerator cards but may be practically any kind of card that might be encountered in a computing system. Other cards that might be found include, but are not limited to, network interface cards, processor cards, security cards, or artificial intelligence/machine learning cards. They may also be combinations of various type cards such as those listed above.

Each of the cards 1105-1110 traffics 16 lanes of signals with a system chipset 1115 on a system board 1120. The electro-optical aggregator card 1125 aggregates four lanes of signals from each of the cards 1105-1110 over the electrical connections 1113. The electrical connections 1113 may be either electrical traces or electrical cables. Optical signals are transmitted and received by the electro-optical aggregator card 1125 through the optical transceiver chip 1130, the optical faceplate connectors 1135, and the external optical cables 1140.

Figure 12:
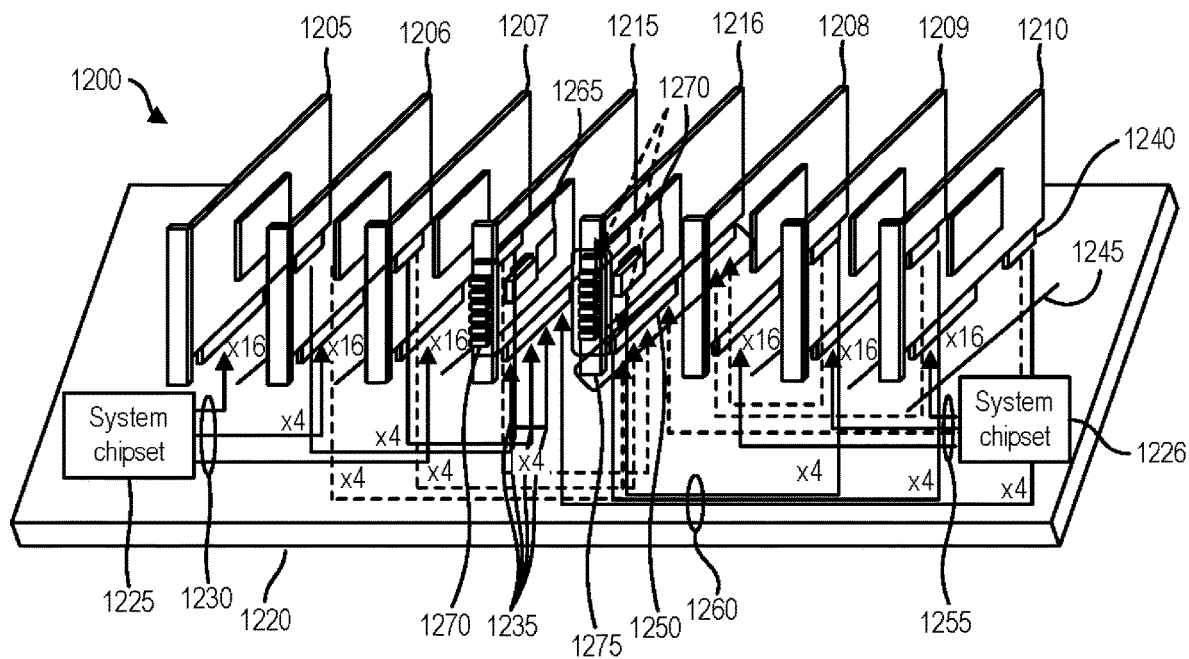
FIG. 12 schematically illustrates one implementation of the electro-optical aggregator system of FIG. 11.

FIG. 12 schematically illustrates one implementation of the electro-optical aggregator system of FIG. 11. The electro-optical aggregator system 1200 includes a plurality of cards 1205-1210, two electro-optical aggregator cards 1215, 1216, and a system board 1220 including two system chipsets 1225, 1226. The cards 1205-1210 are, in this particular example, accelerator cards but may be practically any kind of card that might be encountered in a computing system. Other cards that might be found include, but are not limited to, network interface cards, processor cards, security cards, or artificial intelligence/machine learning cards. They may also be combinations of various type cards such as those listed above. The electro-optical aggregator system 1200 is assembled by blind mating the electrical interfaces 1240 (only one indicated) of the cards 1205-1210 and the board electrical interfaces 1250 (only one indicated) with a system board electrical interface 1245 (only one indicated).

The cards 1205-1207 communicate with the system chipset 1225 over the electrical traces 1230 of the system board 1220, the electrical traces 1230 supporting 16 lanes of signals for each card 1205-1207, and with the electro-optical aggregator card 1215 over the traces 1235 of the system board 1220. The cards 1205-1207 also communicate with the electro-optical aggregator board 1215 over a plurality of electrical traces 1235 of the system board 1220. The electrical traces 1235 support four lanes of signals for each card 1205-1207.

The cards 1208-1210 communicate with the system chipset 1225 over the electrical traces 1255 of the system board 1220, the electrical traces 1255 supporting 16 lanes of signals for each card 1208-1210, and with the electro-optical aggregator card 1216 over the traces 1260 of the system board 1220. The cards 1208-1210 also communicate with the electro-optical aggregator board 1216 over a plurality of electrical traces 1260 of the system board 1220. The electrical traces 1260 support four lanes of signals for each card 1208-1210.

In operation, the electro-optical aggregator card 1215 "aggregates" electro-optical signals trafficked between the electro-optical aggregator card 1215 and the cards 1205-1207. Transmit signals generated by the cards 1205-1207 are electrically transmitted to the electro-optical aggregator card 1215 over the electrical traces 1235. The transmit signal is then converted to an optical signal by the optical transceiver chip 1265 and transmitted via the optical faceplate connector(s) 1275 and external optical cables (not shown). Received signals are received over external optical cables (not shown) by the electro-optical aggregator card 1215 through the optical faceplate connector(s) 1275. The optical transceiver chip 1265 converts them to electrical signals that are then transmitted to the cards 1205-1207 via the traces 1235.

In operation, the electro-optical aggregator card 1216 "aggregates" electro-optical signals trafficked between the electro-optical aggregator card 1216 and the cards 1208-1210. Transmit signals generated by the cards 1208-1210 are electrically transmitted to the electro-optical aggregator card 1216 over the electrical traces 1260. The transmit signal is then converted to an optical signal by the optical transceiver chip 1270 and transmitted via the optical faceplate connector(s) 1275 and external optical cables (not shown). Received signals are received over external optical cables (not shown) by the electro-optical aggregator card 1216 through the optical faceplate connector(s) 1275. The optical transceiver chip 1270 converts them to electrical signals that are then transmitted to the cards 1208-1210 via the traces 1260.

While signals are trafficked among the electro-optical aggregator cards 1215, 1216 and the cards 1205-1210, not all examples will be so limited. Some examples of electro-optical aggregator cards disclosed herein and discussed above have electrical interfaces that include electrical connectors. If such electro-optical aggregator cards are used in a system such as the one shown in FIG. 12, some of the signals may be trafficked over cables rather than electrical traces. Furthermore, some variants of the example in FIG. 12 might also be configured so that the cards 1205-1210 traffic signals with the "other" one of the electro-optical aggregator cards 1215, 1216. Still other variants might aggregate signals from all of the cards 1205-1210 to a single electro-optical aggregator card 1216 as indicated by the dashed lines.

Figure 13:
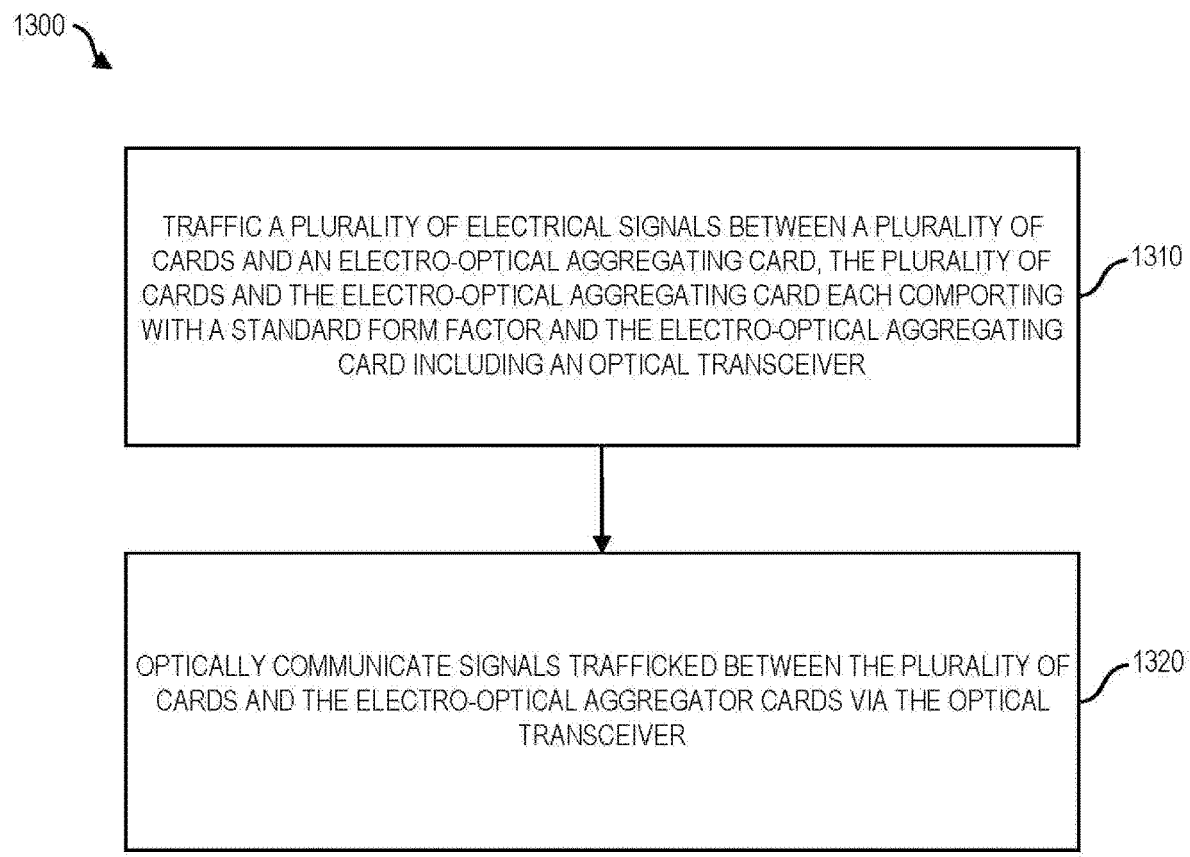
FIG. 13 illustrates a method practiced in accordance with one aspect of the subject matter claimed below in one or more examples.

FIG. 13 illustrates a method practiced in accordance with one aspect of the subject matter claimed below in one or more examples. The method 1300 begins by trafficking (at 1310) a plurality of electrical signals between a plurality of cards and an electro-optical aggregating card. The plurality of cards and the electro-optical aggregating card each comport with a standard form factor and the electro-optical aggregating card includes an optical transceiver chip. The method 1300 then continues by optically communicating (at 1320) signals trafficked between the plurality of cards and the electro-optical aggregator cards via the optical transceiver chip.

This concludes the detailed description. The particular examples disclosed above are illustrative only, as examples described herein may be modified and practiced in different but equivalent manners apparent to those skilled in the art having the benefit of the teachings herein. Furthermore, no limitations are intended to the details of construction or design herein shown, other than as described in the claims below. It is therefore evident that the particular examples disclosed above may be altered or modified and all such variations are considered within the scope and spirit of the appended claims. Accordingly, the protection sought herein is as set forth in the claims below.

What is claimed:

1. An electro-optical aggregator system, comprising:
    a system board;
    a plurality of cards electrically connected to the system board, the plurality of cards each comporting with a standard form factor; and
    an electro-optical aggregator card electrically connected to the system board, comporting with the standard form factor and trafficking electrical signals with the plurality of cards through the system board, the electro-optical aggregator card including an optical transceiver chip through which the trafficked electrical signals are optically communicated.

2. The electro-optical aggregator system of claim 1, wherein the standard form factor is a Peripheral Component Interconnect Express form factor or a Peripheral Component Interconnect Express Enclosure Compatible form factor.

3. The electro-optical aggregator system of claim 1, wherein at least one of the plurality of cards is an accelerator, a network interface card, a processor card, a security card, or an artificial intelligence/machine learning card.

4. The electro-optical aggregator system of claim 1, wherein the optical transceiver chip is a high lane-count optical transceiver chip.

5. The electro-optical aggregator system of claim 1, wherein the signals trafficked between the plurality of cards and the electro-optical aggregator card are trafficked through the system board.

6. The electro-optical aggregator system of claim 5, wherein the signals trafficked between the plurality of cards and the electro-optical aggregator card are also trafficked through cables.

7. The electro-optical aggregator system of claim 1, wherein the signals trafficked between the plurality of cards and the electro-optical aggregator card are trafficked through cables.

8. An electro-optical aggregator card, comprising:
    a printed circuit board defining a bay, the bay having an opening at a proximal end thereof and a back side at a distal end thereof, and the printed circuit board including:
        a first board electrical interface positioned at a distal end of the bay;
        a second board electrical interface through which electrical signals from a plurality of cards may be trafficked through a system board and aggregated; and a plurality of electrical traces between the first board electrical interface and the second board electrical interface; and an electro-optical module inserted through the opening and mounted in the bay, the electro-optical module including:

a faceplate optical connector;

a module electrical interface blind mated with the first board electrical interface of the printed circuit board; and a high lane-count transceiver optically connected to the faceplate optical connector and electrically connected to the module electrical interface to optically transmit the aggregated electrical signals.

9. The electro-optical aggregator card of claim 8, wherein the printed circuit board comports with a Peripheral Component Interconnect Express form factor or a Peripheral Component Interconnect Express Enclosure Compatible form factor.

10. The electro-optical aggregator card of claim 8, wherein the electro-optical module comports with a hot-pluggable sub-adapter card form factor.

11. The electro-optical aggregator card of claim 8, wherein the bay includes:

a first side extending between the opening and the back side; and a second side extending between the opening and the back side; and the printed circuit board further includes:

a first mechanical guide lining the first side from the opening to the back side; and a second mechanical guide lining the second side from the opening to the back side.

12. The electro-optical aggregator card of claim 8, wherein the printed circuit board further includes a third board electrical interface mounted at the distal end thereof or a side thereof.

13. The electro-optical aggregator card of claim 12, wherein the third board electrical interface is a cable connector.

14. The electro-optical aggregator card of claim 12, wherein the second board electrical interface accommodates 16 lanes and the third board electrical interface accommodates 8 lanes.

15. The electro-optical aggregator card of claim 8, wherein the second board electrical interface accommodates 24 lanes.

16. The electro-optical aggregator card of claim 8, wherein the second board electrical interface accommodates 16 lanes, and a third board electrical interface accommodates 8 lanes.

17. The electro-optical aggregator card of claim 8, wherein:

the electro-optical module further includes a modular faceplate;

the faceplate optical connector is a modular faceplate connector; and the modular faceplate connector includes a plurality of retention mechanisms.

18. A method, comprising:

trafficking and aggregating a plurality of electrical signals between a plurality of cards and an electro-optical aggregating card through a system board, the plurality of cards and the electro-optical aggregating card each comporting with a standard form factor and the electro-optical aggregating card including an optical transceiver chip; and optically communicating signals trafficked between the plurality of cards and the electro-optical aggregator card via the optical transceiver chip.

19. The method of claim 18, wherein at least a portion of the electrical signals trafficked between the plurality of cards and the electro-optical aggregator card are trafficked over electrical traces in a system board.

20. The method of claim 19, wherein at least a portion of the electrical signals trafficked between the plurality of cards and the electro-optical aggregator card are trafficked over an electrical cable.

* * * * *